United States Patent
Shirai

[11] Patent Number: 5,677,571
[45] Date of Patent: Oct. 14, 1997

[54] SEMICONDUCTOR PACKAGE HAVING REINFORCED LEAD PINS

[75] Inventor: Koji Shirai, Kitakyushu, Japan

[73] Assignee: Kabushiki Kaisha Toshiba, Kawasaki, Japan

[21] Appl. No.: 974,473

[22] Filed: Nov. 12, 1992

[30] Foreign Application Priority Data

Nov. 12, 1991 [JP] Japan ................ 3-296010

[51] Int. Cl.⁶ .................. H01L 23/48; H01L 23/52; H01L 29/40
[52] U.S. Cl. .................. 257/734; 257/669; 257/674; 257/773; 257/692
[58] Field of Search .................. 257/734, 735, 257/692, 773, 666, 669, 670, 674, 694, 695, 664, 676, 668

[56] References Cited

U.S. PATENT DOCUMENTS

| | | | |
|---|---|---|---|
| 3,628,105 | 12/1971 | Sakai et al. | 257/664 |
| 4,891,687 | 1/1990 | Mallik et al. | 257/664 |
| 4,996,585 | 2/1991 | Gruber et al. | 257/773 |
| 5,028,983 | 7/1991 | Bickford et al. | 357/69 |
| 5,036,380 | 7/1991 | Chase | 357/70 |
| 5,075,760 | 12/1991 | Nakashima et al. | 257/668 |
| 5,105,257 | 4/1992 | Michii | 257/692 |
| 5,237,202 | 8/1993 | Shimizu et al. | 257/672 |
| 5,304,844 | 4/1994 | Horiuchi et al. | 257/676 |
| 5,309,019 | 5/1994 | Moline et al. | 257/676 |

FOREIGN PATENT DOCUMENTS

| | | | |
|---|---|---|---|
| 60-121751 | 6/1985 | Japan | 257/669 |
| 60-218864 | 11/1985 | Japan | 257/692 |
| 01128558 | 5/1989 | Japan | 257/669 |

*Primary Examiner*—Mahshid D. Saadat
*Assistant Examiner*—T. M. Arroyo
*Attorney, Agent, or Firm*—Foley & Lardner

[57] ABSTRACT

The present invention relates to a semiconductor package having lead pins of lead frame for outwardly extending terminals of electrodes of a semiconductor chip embedded in a mold resin. The semiconductor package according to the present invention comprises flat lead fins connected to respective sides of a bed portion of a lead frame, an insulation film for covering at least one side of each of the lead fins, and lead pins formed on a surface of the insulation film, the lead pins being disposed at a predetermined pitch.

6 Claims, 3 Drawing Sheets

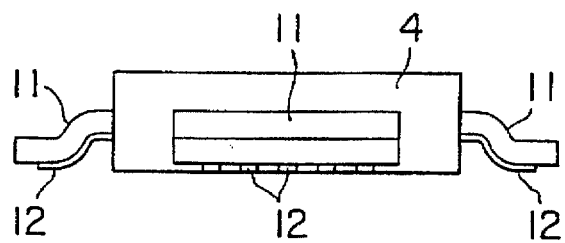
F I G. 3
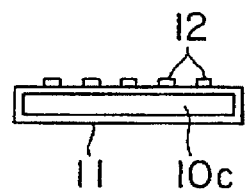
F I G. 4

SEMICONDUCTOR PACKAGE HAVING REINFORCED LEAD PINS

BACKGROUND OF THE INVENTION

1. Field of the Invention

The present invention relates to a semiconductor package, in particular to a semiconductor package having lead pins of lead frame for outwardly extending terminals of electrodes of a semiconductor chip embedded in a mold resin.

2. Description of the Prior Art

A conventional semiconductor package comprises a package main body made of plastic or ceramic and a metal lead frame. In the package main body, a semiconductor chip is embedded. The lead frame has metal lead pins for outwardly extending electrodes of the semiconductor chip.

The construction of a conventional flat package (FP) as an example of a semiconductor package will be described with reference to FIGS. 5 to 7.

In these figures, reference numeral 1 is a semiconductor chip. The semiconductor chip 1 is mounted nearly at the center position of a flat-rectangular shaped bed portion 2a of a metal lead frame 2. Each electrode of the semiconductor chip 1 is electrically connected to a base portion of each lead pin 2b of the lead frame 2 through a metal bonding wire 3. Each lead pin 2b is radially extended. An inner lead on the base portion side of each lead pin 2b is securely embedded in a mold resin 4 constructing the package main body along with the semiconductor chip 1.

In addition, each outer lead extended from the package main body 4 made of mold resin is bent so that the height of the lower surface of each outer lead is equal to or lower than that of the package main body 4.

As integrated circuits are highly integrated, the number of lead pins 2b increases and the size of their packages decreases. Thus, the width of each lead pin 2b becomes short. In addition, the pitch of each lead pins 2b becomes narrow.

However, as the width of each lead pin is shortened, each lead pin becomes weak and tends to easily bend. Thus, the width of each pin further becomes narrow. When the package is mounted on a printed circuit board, a shortcircuit may result in. Moreover, when lead pins are provided, the pitch thereof should be for example 0.3 mm or more. Thus, so far, the size of packages could not be decreased. Therefore, the requirement of large integration of LSI circuits could not be accomplished.

SUMMARY OF THE INVENTION

Therefore, an object of the present invention is to provide a semiconductor package which has lead pins disposed with a narrow pitch while securely preventing a shortcircuit from taking place, whereby satisfying the requirement of large integration of integrated circuits for LSI circuits.

To accomplish the above object, the semiconductor package in accordance with the present invention comprises flat lead fins connected to respective sides of a bed portion of a lead frame, an insulation film for covering at least one side of each of the lead fins, and lead pins formed on a surface of the insulation film, the lead pins being disposed at a predetermined pitch.

According to the above-mentioned construction of the present invention, a large number of lead pins can be formed on a copper foil with a narrow pitch by a photoetching process. In addition, the lead pins are reinforced by the lead fins. When the package is mounted on a printed circuit board, since the lead fins absorb force which takes place at this point, the lead pins can be prevented from being bent. Thus, this invention is suitable for high density surface mounting applications.

In the construction according to the present invention, lead pins can be disposed with a pitch of, for example, 0.1 mm or less which is much narrower than before. Thus, the requirement of decreasing the size of the package and of increasing the integration of LSI circuits can be accomplished.

In addition, the lead pins are reinforced with the lead fins. Thus, when the package is mounted on a printed circuit board, since the lead fins absorb force which takes place at the point, each lead wire does not move. As a result, the present invention is suitable for high density surface mounting applications.

These and other objects, features and advantages of the present invention will become more apparent in light of the following detailed description of a preferred embodiment thereof, as illustrated in the accompanying drawings.

BRIEF DESCRIPTION OF DRAWINGS

FIG. 3 is a side view showing the semiconductor package;

FIG. 4 is a view taken along line A—A of FIG. 1;

DETAILED DESCRIPTION OF PREFERRED EMBODIMENT OF THE INVENTION

Figure 1:
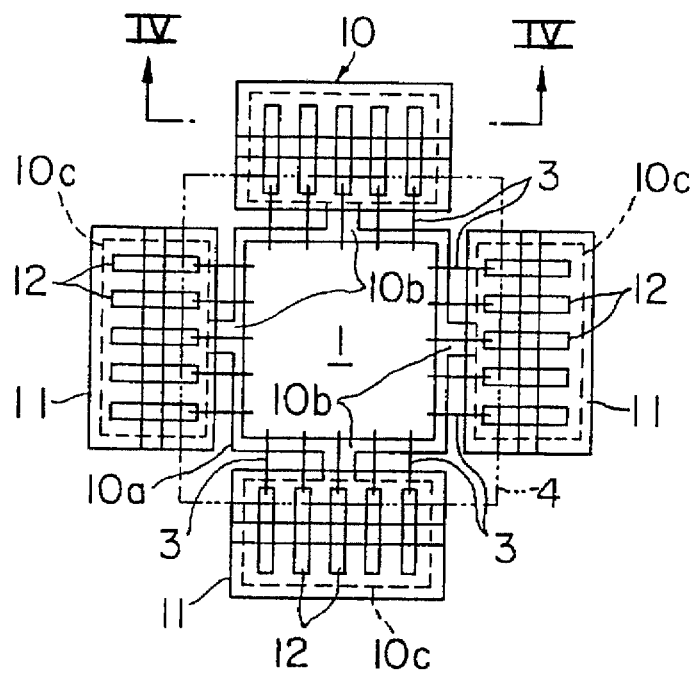
FIG. 1 is a bottom view showing an embodiment of the present invention, wherein a mold resin is omitted.
Figure 2:
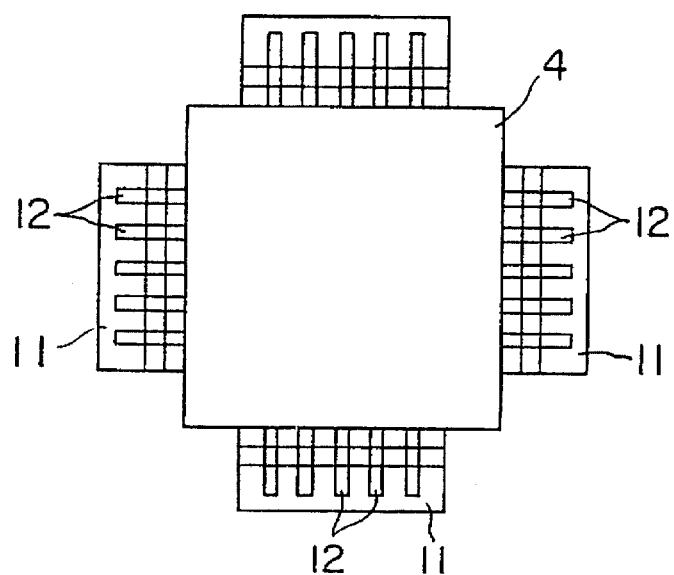
FIG. 2 is a bottom view showing a semiconductor package of the embodiment.
Figure 5:
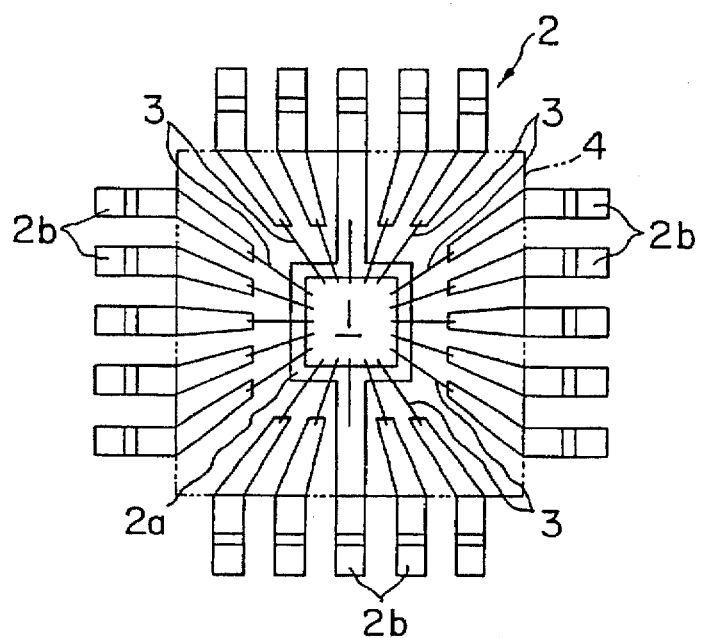
FIG. 5 is a plan view showing a prior art, wherein a mold resin is omitted.
Figure 6:
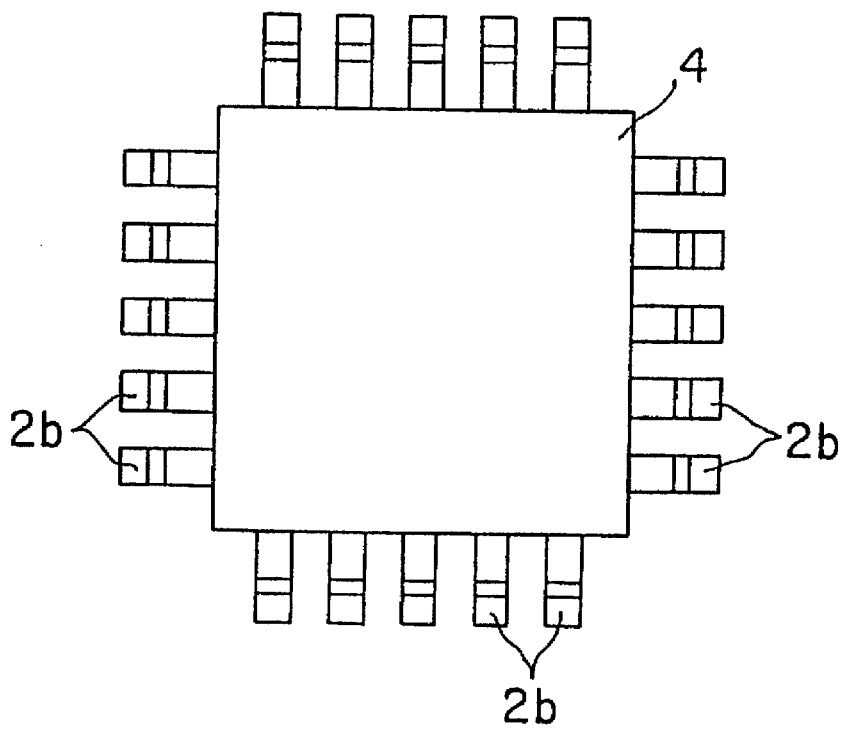
FIG. 6 is a plan view showing a semiconductor package of the prior art.
Figure 7:
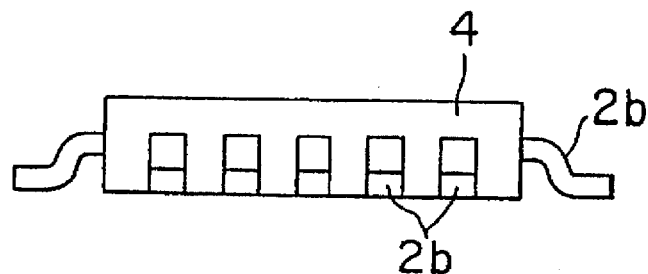
FIG. 7 is a side view showing the semiconductor package of the prior art.

FIGS. 1 to 4 show an embodiment of a 20-pin flat package in accordance with the present invention. On each side of this package, five lead pins are outwardly extended.

A lead frame 10 has a flat-rectangular shaped bed portion 10a. On each side of the bed portion 10a, a flat-rectangular shaped lead fin portion 10c is integrally connected through a connecting portion 10b extended outwardly from nearly center position of each side. The entire outer periphery of each lead fin portion 10c is covered with an insulation film 11 made of resin or ceramic. On the front surface of the insulation film 11, a plurality of lead pins 12 are formed with a very small pitch. Each lead pin 12 functions as an external terminal.

In other words, each electrode of the semiconductor chip 1 mounted on the bed portion 10a is electrically connected to an inner end of each lead pin 12 with a metal bonding wire made of Au, Al, Cu, or the like. An inner lead portion on the inner end side of each lead pin 12 is embedded in a mold resin 4 constructing the package main body along with the semiconductor chip 1.

Each lead pin 12 is formed by a wiring pattern forming method such as a photoetching method or a lift-off method. Thus, the pitch of each lead pin 12 can be decreased to for example 0.1 mm. In addition, the lead pins 12 are reinforced by the flat-rectangular shaped lead fins 10c. Thus, when the package is mounted on a printed circuit board, since the lead fins 10c absorb force which takes place at this point, each lead pin 12 does not move. Therefore, the package is suitable for high density surface mounting applications.

Moreover, the outer lead portion of each lead pin 12 extended from the package main body 4 is downwardly and integrally bent along with each lead fin 10b so that the height of the lower surface of each lead pin 12 is equal to or lower than that of the package main body 4.

In the above-mentioned embodiment, the entire outer periphery of each lead fin 10c was covered with the insulation film 11. However, it should be noted that only the lead pin 12 side of each lead fin 10c can be covered with the insulation film 11 and the opposite side thereof can be peeled off for receiving power from a semiconductor chip board or for cooling heat. Moreover, the insulation film 11 can be disposed only between each lead fin 10b and each lead pin 12.

Furthermore, the surface of the bed portion 10a beneath the semiconductor chip 1 can be covered with the insulation film.

Although the present invention has been shown and described with respect to a preferred embodiment thereof, it should be understood by those skilled in the art that the foregoing and various other changes, omissions, and additions in the form and detail thereof may be made therein without departing form the spirit and scope of the present invention.

What is claimed is:

1. A semiconductor package, comprising:

a lead frame with a bed portion having plural sides;

flat lead fin portions integrally connected to respective sides of the bed portion of the lead frame;

an insulation film covering at least a surface of each of said lead fin portions; and lead pins formed on a surface of said insulation film, said lead pins being disposed at a predetermined pitch;

wherein outer lead portions of the lead pins are extended external to the semiconductor package, and the outer lead portions of the lead pins are bent inward together with the lead fin portions.

2. The semiconductor package as set forth in claim 1, wherein each of said lead fins is a thin-rectangular shaped plate.

3. The semiconductor package as set forth in claim 2, wherein said insulation film is formed on both surfaces of each of said lead fins.

4. The semiconductor package as set forth in claim 1, wherein said insulation film is formed only on a wiring side of each of said lead fins.

5. A semiconductor package for outwardly extending electrode terminals of a semiconductor chip embedded in a mold resin of the semiconductor package, comprising:

a lead frame having a flat-rectangular shaped bed portion and connecting portions, the connecting portions extending outwardly from each side of the bed portion;

flat-rectangular shaped lead fin portions integrally connected to the connecting portions;

insulating films covering an outer periphery of each of the lead fin portions; and lead pins formed on a front surface of the insulating films, said lead pins functioning as external terminals for the semiconductor package, each of the electrode terminals of the semiconductor chip mounted on the bed portion of the lead frame being electrically connected to the inner end of each of the lead pins with a bonding wire, and an inner lead portion on the inner end side of each of said lead pins being embedded in the mold resin, and wherein the strength of the lead pins is reinforced by the flat-rectangular shaped lead fin portions such that the lead fin portions absorb force for said semiconductor package mounted on a printed circuit board, thereby preventing the lead pins from being damaged, wherein outer lead portions of the lead pins are extended external to the semiconductor package, and the outer lead portions of the lead pins are bent inward together with the lead fin portions.

6. The semiconductor package as recited in claim 5, wherein an outer lead portion of each of the lead pins extends from the semiconductor package in a downward direction and is bent so that the height of the lower surface of each of the lead pins is equal to or lower than the height of the semiconductor package.

* * * * *